(12) United States Patent
Bhatia et al.

(10) Patent No.: US 11,742,007 B2
(45) Date of Patent: *Aug. 29, 2023

(54) TECHNIQUES FOR PERFORMING WRITE TRAINING ON A DYNAMIC RANDOM-ACCESS MEMORY

(71) Applicant: NVIDIA CORPORATION, Santa Clara, CA (US)

(72) Inventors: Gautam Bhatia, Mountain View, CA (US); Robert Bloemer, Sterling, MA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/523,779

(22) Filed: Nov. 10, 2021

(65) Prior Publication Data

US 2022/0246184 A1 Aug. 4, 2022

Related U.S. Application Data

(60) Provisional application No. 63/179,954, filed on Apr. 26, 2021, provisional application No. 63/152,817, (Continued)

(51) Int. Cl.
| | | |
|---|---|---|
| G11C 7/10 | (2006.01) | |
| G11C 7/20 | (2006.01) | |
| H03K 19/21 | (2006.01) | |

(52) U.S. Cl.
CPC ............ *G11C 7/109* (2013.01); *G11C 7/1063* (2013.01); *G11C 7/20* (2013.01); *H03K 19/21* (2013.01)

(58) Field of Classification Search
CPC ......... G11C 7/109; G11C 7/1063; G11C 7/20; G11C 9/022; G11C 29/028; H03K 19/21; G06F 3/061; G06F 3/0629; G06F 3/0673
See application file for complete search history.

(56) References Cited

U.S. PATENT DOCUMENTS

| 10,754,563 B2 | 8/2020 | Jung et al. |
| 2003/0191993 A1 | 10/2003 | Miwa |

(Continued)

FOREIGN PATENT DOCUMENTS

| JP | 2007207075 A | * | 8/2007 |
| KR | 20180050816 A | * | 11/2016 |

OTHER PUBLICATIONS

Semiconductor Device And System Including The Same, Kim Seo Jun (Year: 2016).*

(Continued)

*Primary Examiner* — Sultana Begum
(74) *Attorney, Agent, or Firm* — Artegis Law Group, LLP (57) ABSTRACT

Various embodiments include a memory device that is capable of performing write training operations, to determine that certain timing conditions are met, without storing data patterns in memory. Prior approaches for write training involve storing a long data pattern into the memory followed by reading the long data pattern to determine whether the data was written to memory correctly. Instead, the disclosed memory device generates a data pattern within the memory device that matches the data pattern being transmitted to the memory device by an external memory controller. If the data pattern generated by the memory device matches the data pattern received from the memory controller, then the memory device stores a pass status in a register. If the data patterns do not match, then the memory device stores a pass status in a register. The memory controller reads the register to determine whether the write training passed or failed.

20 Claims, 5 Drawing Sheets

Related U.S. Application Data filed on Feb. 23, 2021, provisional application No. 63/152,814, filed on Feb. 23, 2021, provisional application No. 63/144,971, filed on Feb. 2, 2021.

(56) References Cited

U.S. PATENT DOCUMENTS

| | | |
|---|---|---|
| 2013/0044604 A1 | 2/2013 | Hatley |
| 2020/0089413 A1 | 3/2020 | Higashi |
| 2020/0091915 A1* | 3/2020 | Funyu .................... G06F 30/34 |
| 2020/0143854 A1* | 5/2020 | Kim ..................... G11C 7/1078 |

OTHER PUBLICATIONS

CPU, Integrated Circuit Device, Microcomputer, Electronic Equipment and Method for Controlling CPU, Kudo Makoto (Year: 2006).*

Samsung Electronics Co., Ltd., 8Gb GDDR6 SGRAM C-die, Rev. 1.3, Jan. 2020, 187 pages.

Non Final Office Action received for U.S. Appl. No. 17/550,811 dated Feb. 10, 2023, 22 pages.

Final Office Action received for U.S. Appl. No. 17/550,811 dated May 2, 2023, 14 pages.

Notice of Allowance received for U.S. Appl. No. 17/550,811 dated Jun. 30, 2023, 14 pages.

* cited by examiner

TECHNIQUES FOR PERFORMING WRITE TRAINING ON A DYNAMIC RANDOM-ACCESS MEMORY

CROSS-REFERENCE TO RELATED APPLICATIONS

This application claims priority benefit of the United States Provisional Patent application titled, "TECHNIQUES FOR TRANSFERRING COMMANDS TO A DRAM," filed on Feb. 2, 2021 and having Ser. No. 63/144,971. This application further claims priority benefit of the United States Provisional Patent application titled, "DATA SCRAMBLING ON A MEMORY INTERFACE," filed on Feb. 23, 2021 and having Ser. No. 63/152,814. This application further claims priority benefit of the United States Provisional Patent application titled, "DRAM COMMAND INTERFACE TRAINING," filed on Feb. 23, 2021 and having Ser. No. 63/152,817. This application further claims priority benefit of the United States Provisional Patent application titled, "DRAM WRITE TRAINING," filed on Apr. 26, 2021 and having Ser. No. 63/179,954. The subject matter of these related applications are hereby incorporated herein by reference.

BACKGROUND

Field of the Various Embodiments

Various embodiments relate generally to computer memory devices and, more specifically, to techniques for performing write training on a dynamic random-access memory.

Description of the Related Art

A computer system generally includes, among other things, one or more processing units, such as central processing units (CPUs) and/or graphics processing units (GPUs), and one or more memory systems. One type of memory system is referred to as system memory, which is accessible to both the CPU(s) and the GPU(s). Another type of memory system is graphics memory, which is typically accessible only by the GPU(s). These memory systems comprise multiple memory devices. One example memory device employed in system memory and/or graphics memory is synchronous dynamic-random access memory (SDRAM or, more succinctly, DRAM).

Conventionally, a high-speed DRAM memory device employs multiple interfaces. These interfaces include a command address interface for transferring commands to the DRAM. Such commands include a command to initiate a write operation, a command to initiate a read operation, and/or the like. These interfaces further include a data interface for transferring data to and from the DRAM. Command write operations transfer commands to the DRAM synchronously. During command write operations, the DRAM samples the incoming command on certain command input pins relative to a rising edge or a falling edge of a clock signal. Similarly, data write operations transfer data to the DRAM synchronously. During data write transfers, the DRAM samples the incoming data on certain data input pins relative to a rising edge or a falling edge of a clock signal. Further, data read operations transfer data from the DRAM synchronously. During read write transfers, the DRAM presents the outgoing data on certain data output pins relative to a rising edge or a falling edge of a clock signal. The clock signals for command transfers to the DRAM, data transfers to the DRAM, and data transfers from the DRAM may use the same or different clock signals. Further, the data input pins may be the same as or different from the data output pins.

In order to reliably transfer commands and data to and from the DRAM, certain time requirements must be met. One timing requirement is setup time, which defines the minimum amount of time the command or data signals must be stable prior to the clock edge that transfers the command or data signals, respectively. Another timing requirement is hold time, which defines the minimum amount of time the command or data signals must be stable after the clock edge that transfers the command or data signals, respectively. If setup time and/or hold time is not met, then the command and/or data may be transferred with one or more errors, resulting in corrupt command or data information.

As the speed of DRAM memory devices increases, the time between successive clock edges decreases, resulting in a shorter time period within which to meet setup time and hold time. Further, the timing of the clock signal(s), command signals, and data signals are subject to variation due to process variations at the time of manufacture as well as local variations due to changes in operating temperature, supply voltage, interference from other signals, and/or the like. As a result, setup time and hold time are more difficult to meet as DRAM device speeds increase. To mitigate this issue, DRAM memory devices typically have skewing circuits to alter the timing of the command signals and/or data signals relative to the clock signal(s). Periodically, a memory controller associated with the DRAM causes the DRAM to enter a training procedure for command write operations, data write operations, and/or data read operations. During such training procedures, the memory controller changes the skew of one or more command input pins, data input pins, and/or data output pins until the memory controller determines that the DRAM is reliably performing command write operations, data write operations, and/or data read operations, respectively. The memory controller periodically repeats these training operations periodically as operating conditions change over time, such as changes in operating temperature, supply voltage, and/or the like, in order to ensure reliable DRAM operation.

With particular regard to write training, the memory controller writes a write training data pattern or, more succinctly, a data pattern, to a portion of the DRAM memory core. Typically, the data pattern is pseudorandom bit sequence that is suitable for detecting errors on particular data inputs of a DRAM memory device. The memory controller then reads the data pattern from the same portion of the DRAM memory core. If the data pattern that the memory controller reads from the portion of the DRAM memory core matches the data pattern that the memory controller previously wrote to the portion of the DRAM memory core, then the training operation is successful. If, however, the two data patterns do not match, then the memory controller adjusts the skew of the data input pins exhibiting one or more errors. The memory controller iteratively repeats the write training operation and adjusts the skew of data input pins until the data patterns match. The memory controller then returns the DRAM to normal operation.

One disadvantage of this technique for DRAM write training is that, as the speed of DRAM devices increases, the length of the data pattern needed to perform training operations adequately and reliably also increases, whether for write training operations or read training operations. Long data patterns generally require more time to write to the DRAM and read from DRAM, thereby increasing the amount of time to write the data pattern and read the data pattern during write training. Likewise, long data patterns generally require more storage capacity of the DRAM, thereby reducing the amount of memory space available for storing data for purposes other than write training.

In some implementations, a separate memory, such as a first-in-first-out (FIFO) memory to store the data pattern for write training rather than a portion of the portion of the DRAM memory core. The FIFO memory stores the write training pattern rather than the DRAM memory core. The memory controller then reads back the write training pattern from the separate FIFO memory instead of from the DRAM memory core. However, as the size of the data pattern increases, the size of the FIFO memory also increases, thereby consuming a significant portion of the area of the DRAM die and increasing the cost of the DRAM. Although the size of the FIFO memory could be reduced, that would result in only a partial write training data pattern to be stored in the FIFO memory, thereby reducing the effectiveness of the write training operation.

In addition, whether employing a portion of the DRAM memory core or a separate memory such as a FIFO memory, the memory controller writes a long write training data pattern to the DRAM and reads the same long write training data pattern from the DRAM multiple times during each write training operation, thereby reducing the available bandwidth of the DRAM to perform load and store operations for purposes other than write training.

As the foregoing illustrates, what is needed in the art are more effective techniques for performing signal training of memory devices.

SUMMARY

Various embodiments of the present disclosure set forth a computer-implemented method for performing a write training operation on a memory device. The method includes initializing a first register on a memory device with a first data pattern. The method further includes receiving a second data pattern on an input pin of the memory device. The method further includes comparing the first data pattern with the second data pattern to generate a results value. The method further includes storing the results value in a second register. The method further includes that the results value specifies whether the write training operation was successful.

Other embodiments include, without limitation, a system that implements one or more aspects of the disclosed techniques, and one or more computer readable media including instructions for performing one or more aspects of the disclosed techniques, as well as a method for performing one or more aspects of the disclosed techniques.

At least one technical advantage of the disclosed techniques relative to the prior art is that, with the disclosed techniques, lengthy write training data patterns transmitted to a memory device during write training operations do not need to be stored in or read out of the memory device to determine whether the write training operation was successful. Instead, the memory controller only needs to transmit the write training data patterns and read out a pass/fail result to determine whether the write training operation was successful. As a result, write training operations complete in approximately one-half the time relative to prior techniques that require reading out the write training data pattern from the memory device.

Another advantage of the disclosed techniques is that all pins of the data interface are trained concurrently, resulting in a shorter training time relative to traditional approaches. By contrast, with traditional approaches of writing a data pattern to the DRAM memory core and then reading the data pattern back, only the data input/output pins themselves are trained. Additional pins of the data interface that are not stored to the DRAM memory core are trained in a separate training operation after the training of the data pins is complete. By using a pseudorandom bit sequence (PRBS) pattern checker that works on the input/output pin level, all pins of the data interface are trained in parallel, further reducing the training time. These advantages represent one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one skilled in the art that the inventive concepts may be practiced without one or more of these specific details.

System Overview

Figure 1:
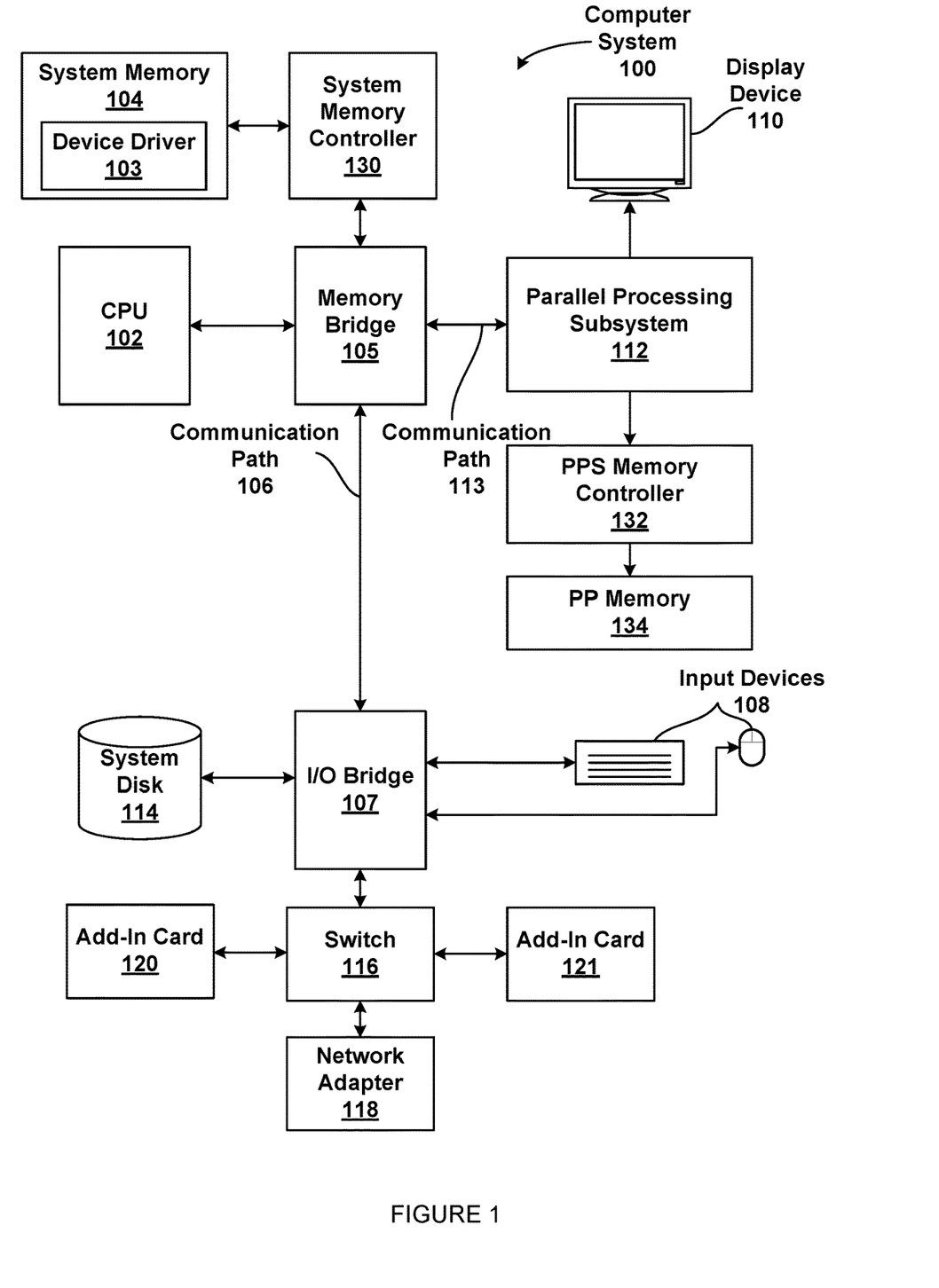
FIG. 1 is a block diagram of a computer system configured to implement one or more aspects of the various embodiments.

FIG. 1 is a block diagram of a computer system 100 configured to implement one or more aspects of the various embodiments. As shown, computer system 100 includes, without limitation, a central processing unit (CPU) 102 and a system memory 104 coupled to a parallel processing subsystem 112 via a memory bridge 105 and a communication path 113. Memory bridge 105 is coupled to system memory 104 via a system memory controller 130. Memory bridge 105 is further coupled to an I/O (input/output) bridge 107 via a communication path 106, and I/O bridge 107 is, in turn, coupled to a switch 116. Parallel processing subsystem 112 is coupled to parallel processing memory 134 via a parallel processing subsystem (PPS) memory controller 132.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and parallel processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high-definition DVD), or other magnetic, optical, or solid-state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 comprises a graphics subsystem that delivers pixels to a display device 110 that may be any conventional cathode ray tube, liquid crystal display, light-emitting diode display, and/or the like. In such embodiments, parallel processing subsystem 112 incorporates circuitry optimized for graphics and video processing, including, for example, video output circuitry. Such circuitry may be incorporated across one or more parallel processing units (PPUs) included within parallel processing subsystem 112. In some embodiments, each PUPS comprises a graphics processing unit (GPU) that may be configured to implement a graphics rendering pipeline to perform various operations related to generating pixel data based on graphics data supplied by CPU 102 and/or system memory 104. Each PPU may be implemented using one or more integrated circuit devices, such as programmable processors, application specific integrated circuits (ASICs), or memory devices, or in any other technically feasible fashion In some embodiments, parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In yet other embodiments, the one or more PPUs included within parallel processing subsystem 112 may be configured to perform graphics processing, general purpose processing, and compute processing operations. System memory 104 includes at least one device driver 103 configured to manage the processing operations of the one or more PPUs within parallel processing subsystem 112.

In various embodiments, parallel processing subsystem 112 may be integrated with one or more other elements of FIG. 1 to form a single system. For example, parallel processing subsystem 112 may be integrated with CPU 102 and other connection circuitry on a single chip to form a system on chip (SoC).

In operation, CPU 102 is the master processor of computer system 100, controlling and coordinating operations of other system components. In particular, CPU 102 issues commands that control the operation of PPUs within parallel processing subsystem 112. In some embodiments, CPU 102 writes a stream of commands for PPUs within parallel processing subsystem 112 to a data structure (not explicitly shown in FIG. 1) that may be located in system memory 104, PP memory 134, or another storage location accessible to both CPU 102 and the PPUs. A pointer to the data structure is written to a pushbuffer to initiate processing of the stream of commands in the data structure. The PPU reads command streams from the pushbuffer and then executes commands asynchronously relative to the operation of CPU 102. In embodiments where multiple pushbuffers are generated, execution priorities may be specified for each pushbuffer by an application program via device driver 103 to control scheduling of the different pushbuffers.

Each PPU includes an I/O (input/output) unit that communicates with the rest of computer system 100 via the communication path 113 and memory bridge 105. This I/O unit generates packets (or other signals) for transmission on communication path 113 and also receives all incoming packets (or other signals) from communication path 113, directing the incoming packets to appropriate components of the PPU. The connection of PPUs to the rest of computer system 100 may be varied. In some embodiments, parallel processing subsystem 112, which includes at least one PPU, is implemented as an add-in card that can be inserted into an expansion slot of computer system 100. In other embodiments, the PPUs can be integrated on a single chip with a bus bridge, such as memory bridge 105 or I/O bridge 107. Again, in still other embodiments, some or all of the elements of the PPUs may be included along with CPU 102 in a single integrated circuit or system of chip (SoC).

CPU 102 and PPUs within parallel processing system 112 access system memory via a system memory controller 130. System memory controller 130 transmits signals to the memory devices included in system memory 104 to initiate the memory devices, transmit commands to the memory devices, write data to the memory devices, read data from the memory devices, and/or the like. One example memory device employed in system memory 104 is double-data rate SDRAM (DDR SDRAM or, more succinctly, DDR). DDR memory devices perform memory write and read operations at twice the data rate of previous generation single data rate (SDR) memory devices.

In addition, PPUs and/or other components within parallel processing system 112 access PP memory 134 via a parallel processing system (PPS) memory controller 132. PPS memory controller 132 transmits signals to the memory devices included in PP memory 134 to initiate the memory devices, transmit commands to the memory devices, write data to the memory devices, read data from the memory devices, and/or the like. One example memory device employed in PP memory 134 synchronous graphics random access memory (SCRAM), which is a specialized form of SDRAM for computer graphics applications. One particular type of SCRAM is graphics double-data rate SCRAM (GDDR SDRAM or, more succinctly, GDDR). Compared with DDR memory devices, GDDR memory devices are configured with a wider data bus, in order to transfer more data bits with each memory write and read operation. By employing double data rate technology and a wider data bus, GDDR memory devices are able to achieve the high data transfer rates typically needed by PPUs.

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

It will be appreciated that the core architecture described herein is illustrative and that variations and modifications are possible. Among other things, the computer system 100 of FIG. 1, may include any number of CPUs 102, parallel processing subsystems 112, or memory systems, such as system memory 104 and parallel processing memory 134, within the scope of the disclosed embodiments. Further, as used herein, references to shared memory may include any one or more technically feasible memories, including, without limitation, a local memory shared by one or more PPUs within parallel processing subsystem 112, memory shared between multiple parallel processing subsystems 112, a cache memory, parallel processing memory 134, and/or system memory 104. Please also note, as used herein, references to cache memory may include any one or more technically feasible memories, including, without limitation, an L1 cache, an L1.5 cache, and L2 caches. In view of the foregoing, persons of ordinary skill in the art will appreciate that the architecture described in FIG. 1 in no way limits the scope of the various embodiments of the present disclosure.

Performing a Write Training Operation on a DRAM

Various embodiments are directed to techniques for efficiently performing write training of a DRAM memory device. A DRAM memory device includes one or more linear feedback shift registers (LFSRs) that generate a write pattern in the form of a pseudo-random bit sequence (PRBS). In some embodiments, each of several input pins of an interface, such as a data interface, undergoing write training operations is coupled to a separate LFSR for checking the PRBS pattern received on the corresponding input pin. To begin write training, a memory controller associated with the memory device transmits a reset command and/or reset signal to the LFSR on the memory device to seed the LFSR. In response, the memory device seeds the LFSR with a predetermined seed value and/or polynomial. Additionally or alternatively, the memory controller seeds the LFSR by transmitting a seed value and/or polynomial to the memory device via another interface that has already been trained such as a separate command address interface. In response, the memory device seeds the LFSR with the seed value and/or polynomial received from the memory controller. In some embodiments, the memory controller includes the reset command, reset signal, or seed value and/or polynomial in a write training command that the memory controller transmits to the memory device via a command address interface. In some embodiments, a write training result register is self-cleared to an initial value when the memory device loads a seed value into the LFSR to prepare the write training result register to receive pass/fail status (also referred to herein as pass/fail results values) for the current write training operation.

During the write training operation, the memory controller transmits a write training pattern to one or more interface pins on the memory device based on the same seed value and/or polynomial used by the memory device to seed the LFSR. As the memory device receives the bit pattern, a write training checker on the one or more interface pins checks the incoming write training pattern on the one or more interface pins against the output of the LFSR in the memory device. In some embodiments, the PRBS checker for an input pin is implemented using exclusive or (XOR) logic.

If the incoming write data pattern matches the data pattern generated by the LFSR in the memory device, then the write training operation passed, and the memory device records a pass status in a write training result register. If, however, the incoming write data pattern does not match the data pattern generated by the LFSR in the memory device, then the write training operation failed, and the memory device records a fail status in the write training result register. In some embodiments, the write training result register includes a separate pass/fail status bit for each input pin undergoing a write training operation.

During the write training operation, the memory controller periodically advances the LFSR on the memory controller by shifting the value in the LFSR on the memory controller. Correspondingly, the memory controller transmits a new write training command to the memory device. In response, the memory device advances the LFSR on the memory device by shifting the value in the LFSR on the memory device. In this manner, the LFSR on the memory controller and the LFSR on the memory device maintain the same value during the write training operation. As a result, the LFSR on the memory controller and the LFSR on the memory device generate the same data pattern during the write training operation.

When the memory device completes all or part of the write training operation, the memory controller reads the value in the write training result register to determine whether the write training operation passed or failed. In some embodiments, the write training result register is self-cleared to an initial value when the value of the write training result register is read by the memory controller. In some embodiments, the write training result register is initially cleared to indicate a fail state. Thereafter, the write training result register is updated as needed after each write training command to indicate whether the write training operation corresponding to the write training command passed or failed. When the status register is read the memory controller, the status register is self-cleared again to indicate a fail state.

Figure 2:
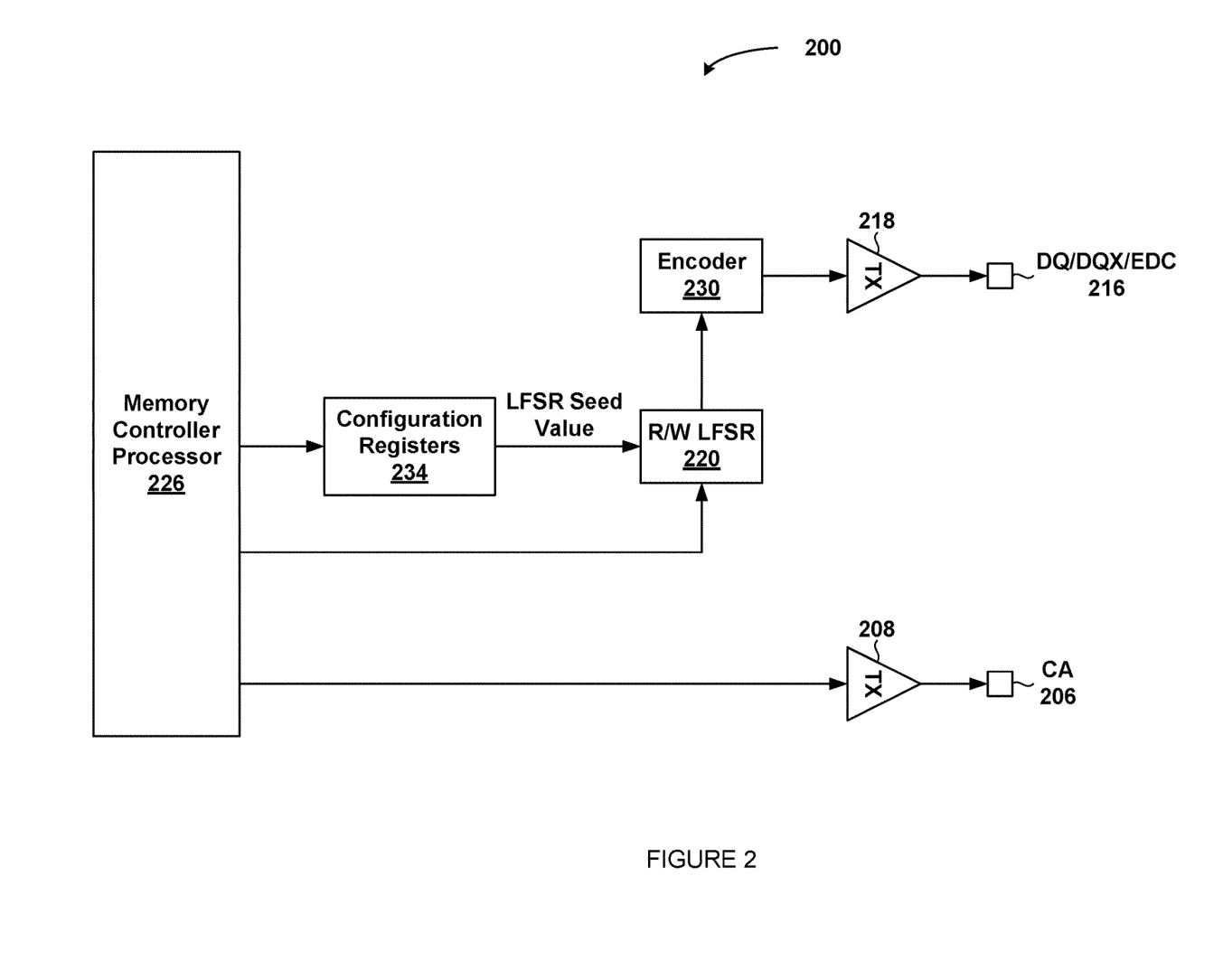
FIG. 2 is a block diagram of a training architecture included in the system memory controller and/or the PPS memory controller of the computer system of FIG. 1, according to various embodiments.

FIG. 2 is a block diagram of a training architecture 200 included in the system memory controller 130 and/or the PPS memory controller 132 of the computer system 100 of FIG. 1, according to various embodiments.

Figure 3:
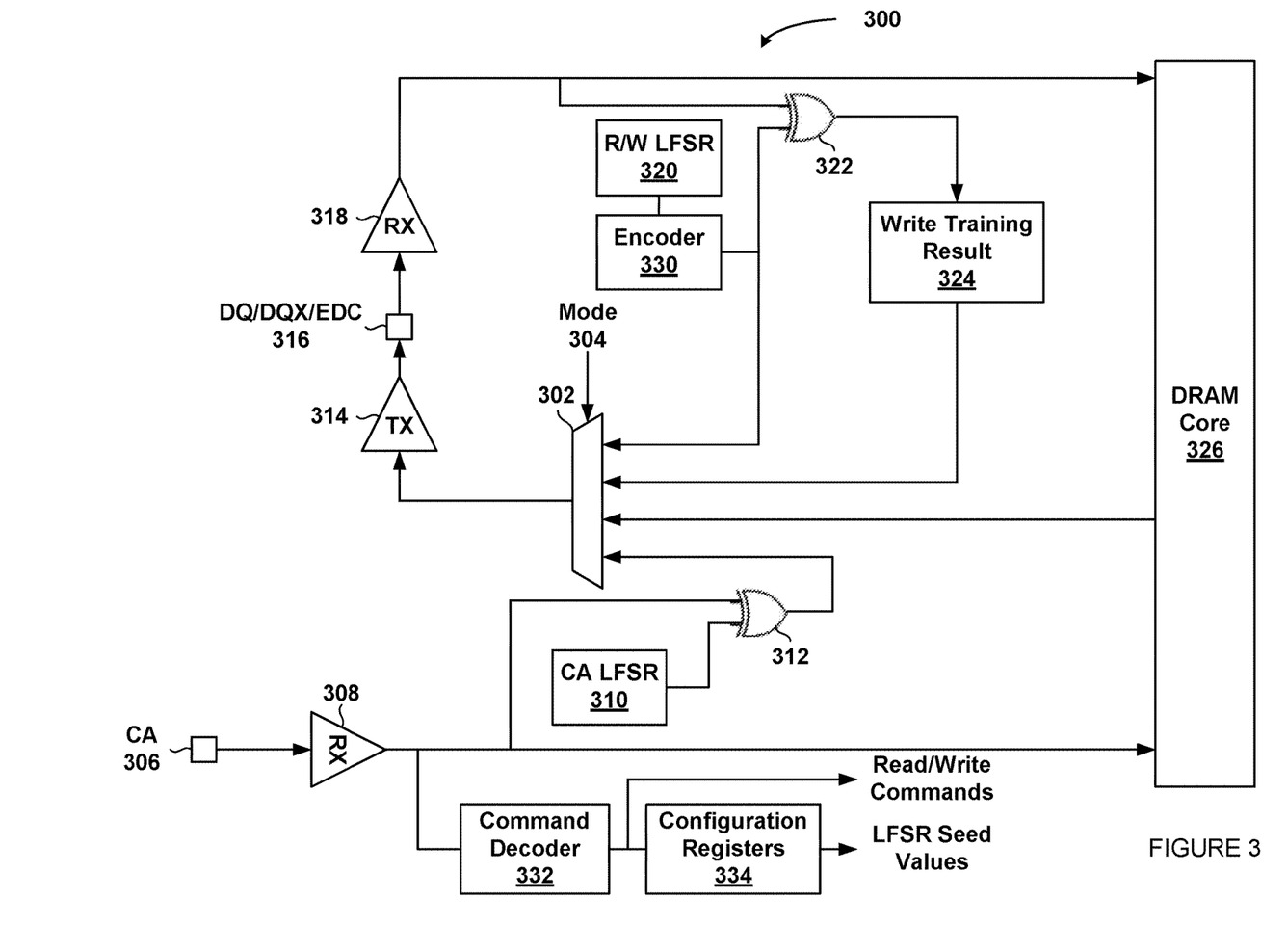
FIG. 3 is a block diagram of a training architecture for a memory device included in system memory and/or parallel processing memory of the computer system of FIG. 1, according to various embodiments.

Training architecture 200 includes a memory controller processor 226 that transmits signals to the components of the training architecture 200 included in the memory controller and to the training architecture 300 of FIG. 3 included in memory devices included in system memory 104 and/or PP memory 134. The memory controller processor 226 transmits signals to initiate the memory devices, transmit commands to the memory devices, write data to the memory devices, read data from the memory devices, and/or the like. Memory controller processor 226 generates commands for transmitting to a memory device and transmits the commands to a transmitter 208. The transmitter 208, in turn, transmits the commands to the memory device via command address (CA) output pins 206.

In addition, memory controller processor 226 transmits read/write command triggers to read/write linear feedback shift register (R/W LFSR) 220, resulting in a synchronization operation. The read/write command trigger may be in the form of a command, signal, and/or the like transmitted by memory controller processor 226 and received by R/W LFSR 220. A first type of synchronization operation resulting from the read/write command trigger initializes R/W LFSR 220 to a known state in order to generate a sequence value. A second type of synchronization operation resulting from the read/write command trigger causes R/W LFSR 220 to change from generating a current sequence value to generating a next sequence value. When R/W LFSR 220 is initialized, R/W LFSR 220 loads an LFSR seed value from configuration registers 234 to generate an initial sequence value. Prior to initialization of R/W LFSR 220, memory controller processor 226 stores the LFSR seed value in configuration registers 234. When R/W LFSR 220 is advanced, R/W LFSR 220 advances from generating a current sequence value to a next sequence value. Memory controller processor 226 initializes and advances R/W LFSR 220 synchronously with the memory device advancing R/W LFSR 320 of FIG. 3 in order to maintain synchronization between R/W LFSR 220 and R/W LFSR 320. In this manner, training architecture 300 can verify that the data received by the memory device matches the data transmitted by the training architecture 200 included in the system memory controller.

R/W LFSR 220 transmits the sequence values to an encoder 230. Encoder 230 performs an encode operation on the sequence values. Sequence values transmitted by training architecture 200 to the DQ, DQX I/O, EDC pins 216 are typically encoded to optimize the signal transmission over the memory interface. The goal of transmitting encoded data over the physical I/O layer between the memory controller and the memory device is to optimize the data for signal transmission. The encoding optimizes the data to minimize transitions on the interface, to minimize crosstalk, to reduce the amount of direct current (DC) power consumed by termination circuit on the interface, and/or the like. The data may be encoded via a maximum transition avoidance (MTA) operation, which reduces the number of low-to-high and/or high-to-low signal transitions in order to improve the signal-to-noise ratio (SNR) on the memory interface. Additionally or alternatively, the data may be encoded via a data bus inversion (DBI) operation in order to reduce the number of high signal values on the memory interface in order to reduce power consumed over the memory interface. Additionally or alternatively, the data may be encoded via any technically feasible operation.

Encoder 230 generates encoded sequence values for transmitting to the memory device and transmits the encoded sequence values to a transmitter 218. The transmitter 218, in turn, transmits the encoded sequence values to the memory device via one or more data (DQ), extended data (DQX), and/or error detection and correction (EDC) pins 216.

FIG. 3 is a block diagram of a training architecture 300 for a memory device included in system memory 104 and/or parallel processing memory 134 of the computer system 100 of FIG. 1, according to various embodiments. As further described, the training architecture 300 includes components for command address interface training, data read interface training, and data write interface training. Via these components, the training architecture 300 performs command address training operations, data read training operations, and data write training operations without the need to store training data in the DRAM core 326 of the memory device. When operating the memory device at higher speeds, the memory controller periodically performs these training operations in order to meet setup time and hold time on all of the input pins and output pins of the memory device.

In general, the memory controller performs training operations in a particular order. First, the memory controller performs training operations on the command address interface. The command address interface training may be performed via any technical feasible techniques. By training the command address interface first, the memory device is ready to receive commands and write mode registers as needed to perform data read interface training, and data write interface training. In general, the command address interface functions without training as long as setup and hold time are met on all command address (CA) input pins 306. The memory controller causes a seed value and/or polynomial to be loaded into the command address linear feedback shift register (CA LFSR) 310. The memory controller applies a data pattern to one or more CA input pins 306. The CA input pins 306 are transmitted via receiver 308 to the CA LFSR 310 and to XOR gate 312. The CA LFSR 310 replicates the same pattern as the memory controller. The XOR gate 312 compares the data pattern on the CA input pins 306 with the data from the CA LFSR 310. The XOR gate 312 transmits a low value if the data pattern on the CA input pins 306 match the data from the CA LFSR 310. The XOR gate 312 transmits a high value if the data pattern on the CA input pins 306 does not match the data from the CA LFSR 310. The mode 304 input to multiplexor 302 selects the bottom input to transmit the output of the XOR gate 312 to transmitter 314 and then to one or more data (DQ), extended data (DQX), and/or error detection and correction (EDC) pins 316. The memory controller then reads the one or more DQ, DQX, and/or EDC pins 316 to determine whether the command address input training was successful. Once the command address input training completes, command addresses received from the memory controller pass through CA input pins 306 and receiver 308 and then to the DRAM core 326. In various embodiments, feedback from the memory device for various use cases resulting from interface training may be transmitted by the memory device to the memory controller over any one or more one or more DQ, DQX, and/or EDC pins 316, in any technically feasible combination.

After command address interface training is complete, the memory controller can transmit commands to the memory device to facilitate data read interface training and data write interface training. The memory device receives these commands via CA input pins 306. Receiver 308 transmits the commands from CA input pins 306 to a command decoder 332. Command decoder 332 decodes the commands received from training architecture 200 included in the memory controller. Some commands store values to and/or load values from configuration registers 334. For example, command decoder 332 can receive a command to store a value in configuration registers 334 to store a linear feedback shift register (LFSR) seed value that is loaded into a read/write linear feedback shift register (R/W LFSR) 320 each time that R/W LFSR 320 is initialized.

Some commands perform various operations in the memory device. For example, command decoder 332 can receive a read command and, in response, the memory device performs a read operation to load data from DRAM core 326 and transmit the data to the memory controller. Similarly, command decoder 332 can receive a write command and, in response, the memory device performs a write operation to store data received from the memory controller in DRAM core 326. Further, if command decoder 332 receives a read command or a write command during data read interface training or data write interface training, then command decoder 332 transmits a trigger derived from the read/write commands to R/W LFSR 320. The read/write command trigger initializes R/W LFSR 320 to generate a first sequence value and/or advances R/W LFSR 320 from a current sequence value to a next sequence value.

Second, the memory controller performs training operations on the data read interface. in general, training operations on the data read interface are performed before training operations on the data write interface. This order of training operations ensures that read data is correct from the memory device, which allows the memory controller to perform optimal write training operations. The memory controller transmits a command to the memory device that causes a seed value and/or polynomial to be loaded into R/W LFSR 320. R/W LFSR 320 transmits a series of sequence values based on the seed value and/or polynomial to an encoder 330.

Encoder 330 performs an encode operation on the sequence values. Sequence values transmitted by R/W LFSR 320 to the DQ, DQX I/O pins 316 are typically encoded to optimize the signal transmission over the memory interface. The goal of transmitting encoded data over the physical I/O layer between the memory controller and the memory device is to optimize the data for signal transmission. The encoding optimizes the data to minimize transitions on the interface, to minimize crosstalk, to reduce the amount of direct current (DC) power consumed by termination circuit on the interface, and/or the like. The data may be encoded via a maximum transition avoidance (MTA) operation, which reduces the number of low-to-high and/or high-to-low signal transitions in order to improve the signal-to-noise ratio (SNR) on the memory interface. Additionally or alternatively, the data may be encoded via a data bus inversion (DBI) operation in order to reduce the number of high signal values on the memory interface in order to reduce power consumed over the memory interface. Additionally or alternatively, the data may be encoded via any technically feasible operation.

The mode 304 input to multiplexor 302 selects the top input to transmit the output of encoder 330 to transmitter 314 and then to one or more data (DQ), extended data (DQX), and/or error detection and correction (EDC) pins 316. The memory controller then reads the one or more DQ, DQX, and/or EDC pins 316 to determine whether the received data is the expected pattern from the R/W LFSR 320.

Third, the memory controller performs training operations on the data write interface. The memory controller causes a seed value and/or polynomial to be loaded into the R/W LFSR 320. The memory controller applies a data pattern to one or more DQ, DQX, and/or EDC pins 316. The DQ, DQX, and/or EDC pins 316 are transmitted via receiver 318 to the R/W LFSR 320 and to XOR gate 322. The R/W LFSR 320 replicates the same pattern as R/W LFSR 220 on the memory controller. Encoder 330 encodes the pattern presented by R/W LFSR 320 to replicate the encoded data received from the memory controller via receiver 318. The XOR gate 322 compares the data pattern on the DQ, DQX, and/or EDC pins 316 with the data from encoder 330. The XOR gate 322 transmits a low value if the data pattern on the CA input pins 306 match the data from encoder 330. The XOR gate 322 transmits a high value if the data pattern on the DQ, DQX, and/or EDC pins 316 does not match the data from encoder 330. The output of the XOR gate 322 is transmitted to the write training result register 324 and stored as pass/fail write training status for each of the DQ, DQX, and/or EDC pins 316 undergoing write training. The memory controller reads the write training result register 324 to determine the results of the write training operations. When the memory controller reads the write training result register 324, the mode 304 input to multiplexor 302 selects the second from the top input to transmit the output of the write training result register 324 through transmitter 314 and then to one or more DQ, DQX, and/or EDC pins 316. The memory controller then reads the one or more DQ, DQX, and/or EDC pins 316 to determine whether the data write training was successful. Once the data write training completes, write data received from the memory controller pass through DQ, DQX, and/or EDC pins 316 and receiver 318 and then to the DRAM core 326.

In some embodiments, once a fail status is stored in write training result register 324, the fail status remains in write training result register 324 until the occurrence of a reset of the memory device. Even if a subsequent data write interface training operation results in a pass status, write training result register 324 does not change the fail status to a pass status. Instead, write training result register 324 maintains the fail status from the prior failed data write interface training operation. In these embodiments, a fail status indicates that at least one data write interface training operation performed since the last reset of the memory device resulted in a fail status. The fail status is cleared upon a reset of the memory device. The reset of the memory device may be performed in response to reading a register that triggers the reset, by loading R/W LFSR 220 with a seed value, by receiving a signal on a reset pin of the memory device, and/or the like.

Once the data read training and data write training completes, the mode 304 input to multiplexor 302 selects the second from the bottom input to transmit the output of the DRAM core 326 to transmitter 314 and then to one or more data (DQ), extended data (DQX), and/or error detection and correction (EDC) pins 316.

It will be appreciated that the system shown herein is illustrative and that variations and modifications are possible. Among other things, the training architecture 300 includes components for command address interface training, data read interface training, and data write interface training. However, the training architecture 300 may include components for training any other technically feasible input and/or output interface within the scope of the present disclosure. Further, in some examples, a single LFSR generates the source signal, such as a pseudorandom bit sequence (PRBS), for training any combination of one or more I/O pins of the memory device, including all of the I/O pins of the memory device. Additionally or alternatively, one LFSR may generate a PRBS for training any one or more I/O pins of the memory device. Additionally or alternatively, multiple LFSRs may generate a PRBS for one or more I/O pins of the memory device, as now described.

Figure 4:
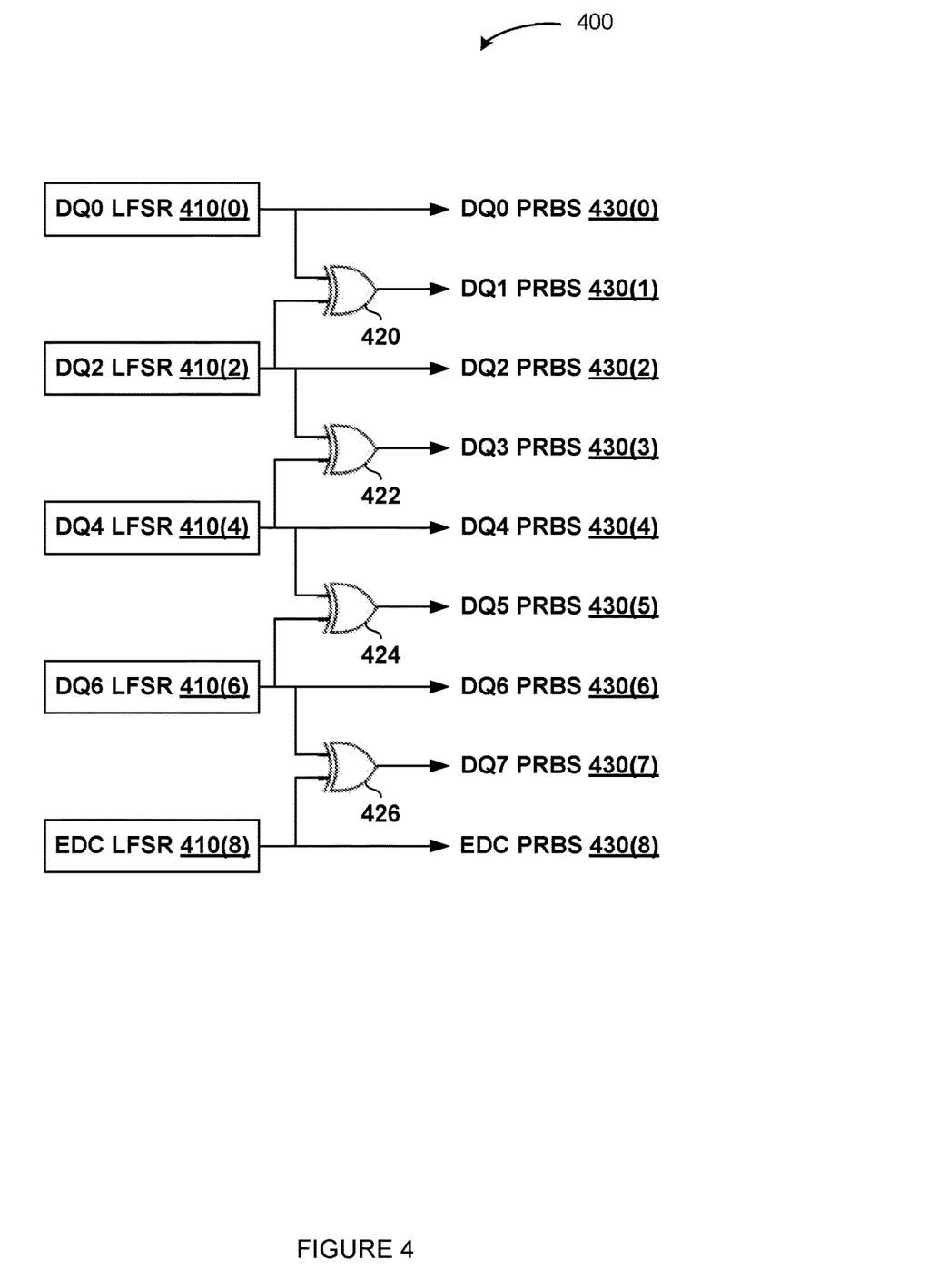
FIG. 4 is a block diagram of a linear feedback shift register (LFSR) subsystem for a memory device included in system memory and/or parallel processing memory of the computer system of FIG. 1, according to various embodiments.

FIG. 4 is a block diagram of a linear feedback shift register (LFSR) subsystem 400 for a memory device included in system memory 104 and/or parallel processing memory 134 of the computer system 100 of FIG. 1, according to various embodiments. As shown, the LFSR subsystem 400 includes a number of LFSRs 410(0)-410(4) as well as a number of XOR gates 420(0)-420(3).

The LFSR subsystem 400 includes LFSRs 410(0)-410(3) that directly generate bit sequences, such as pseudo-random bit sequences (PRBSs) for specific I/O pins of the memory device. In that regard, DQ0 LFSR 410(0) generates a DQ0 PRBS 430(0) for bit 0 of the data pins bus of the memory device. Likewise, DQ2 LFSR 410(2) generates a DQ2 PRBS 430(2) for bit 2 of the data pins bus of the memory device. In a similar fashion, DQ4 LFSR 410(4) generates a DQ4 PRBS 430(4) for bit 4 of the data pins bus of the memory device, and DQ6 LFSR 410(6) generates a DQ6 PRBS 430(6) for bit 6 of the data pins bus of the memory device. Error detection and correction (EDC) LFSR 410(8) generates an EDC PRBS 430(8) for an EDC bit of the EDC pins bus of the memory device.

The LFSR subsystem 400 generates PRBSs for the remaining DQ bits based on any technically feasible combination of two or more of the outputs of the DQ LFSRs 410(0)-(8) included in the LFSR subsystem 400. In some examples, LFSR subsystem 400 generates DQ1 PRBS 430 (1) based on a logical combination of two or more other LFSRs, such as the output of XOR gate 420 that performs an XOR function on the output of DQ0 LFSR 410(0) and DQ2 LFSR 410(2). Similarly, LFSR subsystem 400 generates DQ3 PRBS 430(1) based on a logical combination of two or more other LFSRs, such as the output of XOR gate 422 that performs an XOR function on the output of DQ2 LFSR 410(2) and DQ4 LFSR 410(4).

LFSR subsystem 400 generates DQ5 PRBS 430(5) based on any technically feasible logical combination of the outputs of two or more other LFSRs, such as the output of XOR gate 424 that performs an XOR function on the output of DQ4 LFSR 410(4) and DQ6 LFSR 410(6). LFSR subsystem 400 generates DQ7 PRBS 430(7) based on a logical combination of two or more other LFSRs, such as the output of XOR gate 426 that performs an XOR function on the output of DQ6 LFSR 410(6) and the output of EDC LFSR 410(8). By sharing LFSRs among multiple outputs, LFSR subsystem 400 generates a unique PRBS for each output of a particular signal bus without having to dedicate a separate LFSR for each output of the signal bus. In the above example, LFSR subsystem 400 includes only 5 LFSRs and yet generates unique PRBSs for each of 8 signal bus outputs.

It will be appreciated that the system shown herein is illustrative and that variations and modifications are possible. In some examples, the techniques described in conjunction with the data (DQ) pins of the memory device may be employed for the extended data (DQX) pins, error detection and correction (EDC) pins, command address (CA) pins, and/or any other input/output pins of the memory device.

Additionally or alternatively, the patterns generated by the memory device may be subject to an encoding scheme that reduces and/or eliminates the maximum transitions for training, such as an encoding scheme based on phase amplitude modulation (PAM4) signaling parameters. As a result, the patterns generated by the memory device can eliminate the need to add complete MTA encoder logic, which can be expensive.

In some examples, when LFSR subsystem 400 transmits randomized LFSR data from parallel processing subsystem 112 to DRAM core 326, if LFSR subsystem 400 does not perform some type of encoding to avoid maximum transitions, then the training results may be negatively impacted. As a result, the training results may be sub-optimal because the regular read/write operations avoid maximum transitions by using MTA encoding logic. Therefore, LFSR subsystem 400 can perform low overhead techniques to mimic the benefits of MTA without having to implement full MTA encoding and decoding logic. These techniques involve detection of maximum transitions on the random LFSR output. The techniques convert the maximum transitions on the random LFSR output to non-maximum transitions (0<->2, 0<->1, no transition, and/or the like). More generally, the encoding performed by LFSR subsystem 400 can manipulate random data so as to mimic the characteristics of MTA encoding/decoding without adding complete MTA encoder/decoder logic to LFSR subsystem 400.

Figure 5:
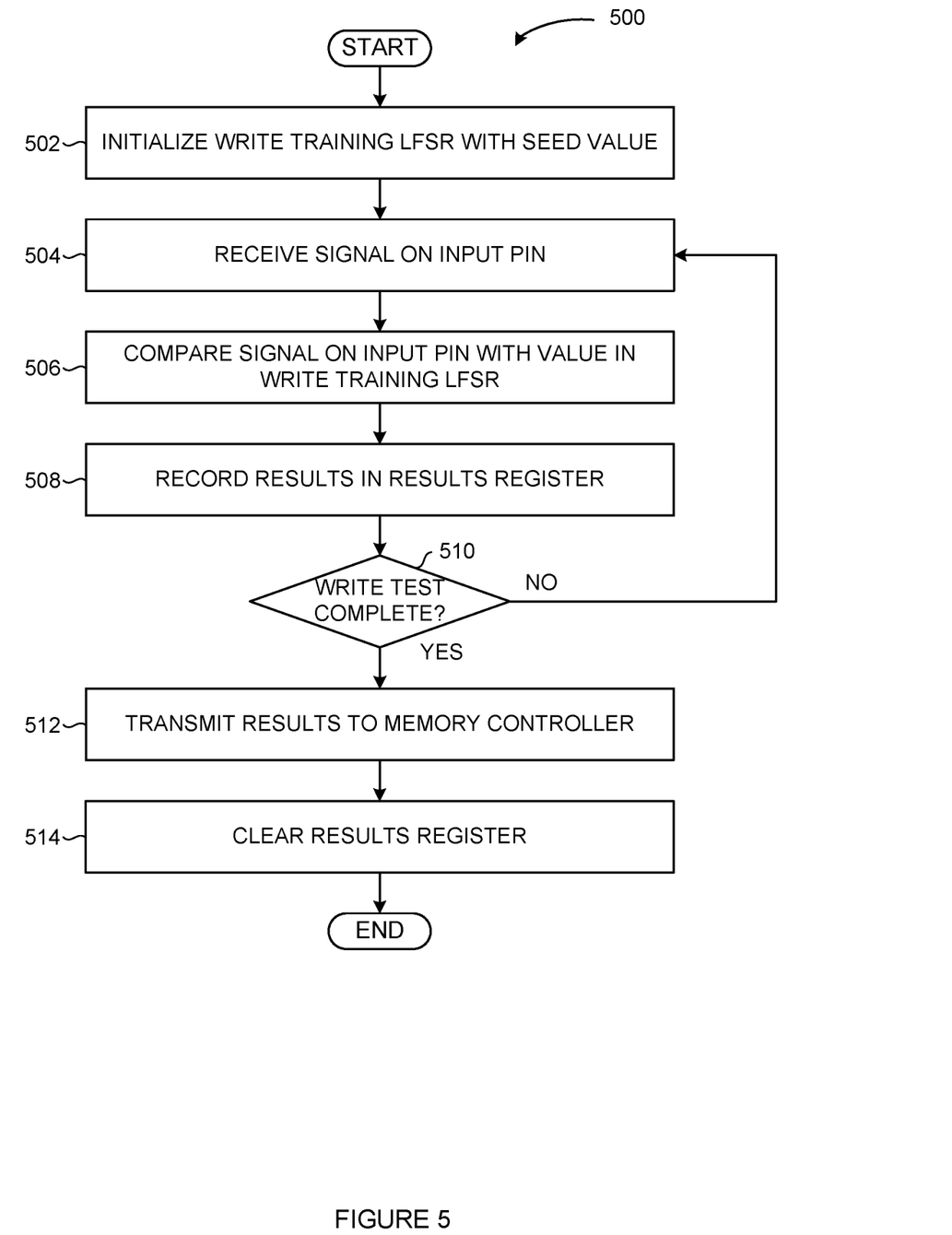
FIG. 5 is a flow diagram of method steps for performing a write training operation on a memory device included in system memory and/or parallel processing memory of the computer system of FIG. 1, according to various embodiments.

FIG. 5 is a flow diagram of method steps for performing a write training operation on a memory device included in system memory 104 and/or parallel processing memory 134 of the computer system of FIG. 1, according to various embodiments. Although the method steps are described in conjunction with the systems of FIGS. 1-4, persons of ordinary skill in the art will understand that any system configured to perform the method steps, in any order, is within the scope of the present disclosure.

As shown, a method 500 begins at step 502, where a memory device initializes a write training LFSR, such as the R/W LFSR 320, on the memory device with a seed value. The memory controller causes a seed value and/or polynomial to be loaded into the R/W LFSR 320. To begin write training, a memory controller associated with the memory device transmits a reset command and/or reset signal to the R/W LFSR 320 on the memory device to seed the R/W LFSR 320. In response, the memory device seeds the R/W LFSR 320 with a predetermined seed value and/or polynomial. Additionally or alternatively, the memory controller seeds the R/W LFSR 320 by transmitting a seed value and/or polynomial to the memory device via another interface that has already been trained such as a separate command address interface. In response, the memory device seeds the R/W LFSR 320 with the seed value and/or polynomial received from the memory controller. In some embodiments, the memory controller includes the reset command, reset signal, or seed value and/or polynomial in a write training command that the memory controller transmits to the memory device via a command address interface. In some embodiments, a write training result register is self-cleared to an initial value when the memory device loads a seed value into the LFSR to prepare the write training result register to receive pass/fail status for the current write training operation.

At step 504, the memory device receives a data pattern in the form of a signal on an input pin. The memory controller applies the data pattern to one or more DQ, DQX, and/or EDC pins 316.

At step 506, the memory device compares a signal on the input pin with the value in the write training LFSR, such as the R/W LFSR 320. The DQ, DQX, and/or EDC pins 316 are transmitted via receiver 318 to the R/W LFSR 320 and to XOR gate 322. The R/W LFSR 320 replicates the same pattern as the memory controller. The XOR gate 322 compares the data pattern on the DQ, DQX, and/or EDC pins 316 with the data from the R/W LFSR 320. The XOR gate 322 transmits a low value if the data pattern on the CA input pins 306 match the data from the R/W LFSR 320. The XOR gate 322 transmits a high value if the data pattern on the DQ, DQX, and/or EDC pins 316 does not match the data from the R/W LFSR 320.

At step 508, the memory device records the results in a results register, such as the write training result register 324. The output of the XOR gate 322 is transmitted to the write training result register 324 and stored as pass/fail write training status for each of the DQ, DQX, and/or EDC pins 316 undergoing write training. The memory device optionally advances the R/W LFSR 320. During the write training operation, the memory controller periodically advances the LFSR on the memory controller by shifting the value in the LFSR on the memory controller. Correspondingly, the memory controller transmits a new write training command to the memory device. In response, the memory device advances the R/W LFSR 320 on the memory device by shifting the value in the R/W LFSR 320 on the memory device. In this manner, the LFSR on the memory controller and the R/W LFSR 320 on the memory device maintain the same value during the write training operation. As a result, the LFSR on the memory controller and the R/W LFSR 320 on the memory device generate the same data pattern during the write training operation At step 510, the memory device determines whether the write test is complete. The memory device may determine whether the test is complete based on completing a number of iterations of the write training operation, based on a command received from the memory controller, and/or the like. If the memory device determines that the write test is not complete, then the method 500 proceeds to step 504, described above.

If, however, the memory device determines that the write test is complete, then the method 500 proceeds to step 512, where the memory device transmits the results to the memory controller. When the memory device completes all or part of the write training operation, the memory controller reads the write training result register 324 to determine the results of the write training operations and thereby determine whether the write training operation passed or failed. When the memory controller reads the write training result register 324, the mode 304 input to multiplexor 302 selects the second from the top input to transmit the output of the write training result register 324 through transmitter 314 and then to one or more DQ, DQX, and/or EDC pins 316. The memory controller then reads the one or more DQ, DQX, and/or EDC pins 316 to determine whether the data write training was successful.

At step 514, the memory device clears the results register. In some embodiments, the write training result register is self-cleared to an initial value when the value of the write training result register is read by the memory controller. In some embodiments, the write training result register is initially cleared to indicate a fail state. Thereafter, the write training result register is updated as needed after each write training command to indicate whether the write training operation corresponding to the write training command passed or failed. When the status register is read the memory controller, the status register is self-cleared again to indicate a fail state.

The method 500 then terminates. Alternatively, the method 500 proceeds to step 502 to perform additional write training operations.

In sum, various embodiments are directed to techniques for efficiently performing write training of a DRAM memory device. A DRAM memory device includes one or more linear feedback shift registers (LFSRs) that generate a write pattern in the form of a pseudo-random bit sequence (PRBS). In some embodiments, each of several input pins of an interface undergoing write training operations, such as a data interface, is coupled to a separate LFSR for checking the PRBS pattern received on the corresponding input pin. To begin write training, a memory controller associated with the memory device transmits a reset command and/or reset signal to the LFSR on the memory device to seed the LFSR. In response, the memory device seeds the LFSR with a predetermined seed value and/or polynomial. Additionally or alternatively, the memory controller seeds the LFSR by transmitting a seed value and/or polynomial to the memory device via another interface that has already been trained such as a separate command address interface. In response, the memory device seeds the LFSR with the seed value and/or polynomial received from the memory controller. In some embodiments, the memory controller includes the reset command, reset signal, or seed value and/or polynomial in a write training command that the memory controller transmits to the memory device via a command address interface. In some embodiments, a write training result register is self-cleared to an initial value when the memory device loads a seed value into the LFSR to prepare the write training result register to receive pass/fail status for the current write training operation.

During the write training operation, the memory controller transmits a write training pattern to one or more interface pins on the memory device based on the same seed value and/or polynomial used by the memory device to seed the LFSR. As the memory device receives the bit pattern, a write training checker on the one or more interface pins checks the incoming write training pattern on the one or more interface pins against the output of the LFSR in the memory device. In some embodiments, the PRBS checker for an input pin is implemented using XOR logic.

If the incoming write data pattern matches the data pattern generated by the LFSR in the memory device, then the write training operation passed, and the memory device records a pass status in a write training result register. If, however, the incoming write data pattern does not match the data pattern generated by the LFSR in the memory device, then the write training operation failed, and the memory device records a fail status in the write training result register. In some embodiments, the write training result register includes a separate pass/fail status bit for each input pin undergoing a write training operation.

During the write training operation, the memory controller periodically advances the LFSR on the memory controller by shifting the value in the LFSR on the memory controller. Correspondingly, the memory controller transmits a new write training command to the memory device. In response, the memory device advances the LFSR on the memory device by shifting the value in the LFSR on the memory device. In this manner, the LFSR on the memory controller and the LFSR on the memory device maintain the same value during the write training operation. As a result, the LFSR on the memory controller and the LFSR on the memory device generate the same data pattern during the write training operation.

When the memory device completes all or part of the write training operation, the memory controller reads the value in the write training result register to determine whether the write training operation passed or failed. In some embodiments, the write training result register is self-cleared to an initial value when the value of the write training result register is read by the memory controller. In some embodiments, the write training result register is initially cleared to indicate a fail state. Thereafter, the write training result register is updated as needed after each write training command to indicate whether the write training operation corresponding to the write training command passed or failed. When the status register is read the memory controller, the status register is self-cleared again to indicate a fail state.

At least one technical advantage of the disclosed techniques relative to the prior art is that, with the disclosed techniques, lengthy write training data patterns transmitted to a memory device during write training operations do not need to be stored in or read out of the memory device to determine whether the write training operation was successful. Instead, the memory controller only needs to transmit the write training data patterns and read out a pass/fail result to determine whether the write training operation was successful. As a result, write training operations complete in approximately one-half the time relative to prior techniques that require reading out the write training data pattern from the memory device.

Another advantage of the disclosed techniques is that all pins of the data interface are trained concurrently, resulting in a shorter training time relative to traditional approaches. By contrast, with traditional approaches of writing a data pattern to the DRAM memory core and then reading the data pattern back, only the data input/output pins themselves are trained. Additional pins of the data interface that are not stored to the DRAM memory core are trained in a separate training operation after the training of the data pins is complete. By using a PRBS pattern checker that works on the input/output pin level, all pins of the data interface are trained in parallel, further reducing the training time. These advantages represent one or more technological improvements over prior art approaches.

Any and all combinations of any of the claim elements recited in any of the claims and/or any elements described in this application, in any fashion, fall within the contemplated scope of the present disclosure and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method, or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for performing a write training operation on a memory device, the method comprising:
   initializing a first register on the memory device with a first data pattern based on a seed value stored in a second register;
   receiving a second data pattern on an input pin of the memory device;
   comparing the first data pattern with the second data pattern to generate a results value; and
   storing the results value in a third register, wherein the results value specifies whether the write training operation was successful.

2. The computer-implemented method of claim 1, further comprising:
   determining that the first data pattern matches the second data pattern,
   wherein the results value indicates a pass result.

3. The computer-implemented method of claim 1, further comprising:
  determining that the first data pattern does not match the second data pattern,
  wherein the results value indicates a fail result.

4. The computer-implemented method of claim 1, further comprising:
  receiving a command to read the results value; and
  transmitting the results value to an output pin of the memory device.

5. The computer-implemented method of claim 4, further comprising, subsequent to transmitting the results value, initializing the third register to an initial value.

6. The computer-implemented method of claim 1, wherein comparing the first data pattern with the second data pattern comprises performing an exclusive-or (XOR) operation on the first data pattern and the second data pattern.

7. The computer-implemented method of claim 6, wherein the results value is based on an output of the XOR operation.

8. The computer-implemented method of claim 1, wherein initializing the first register comprises:
  receiving a reset command from a memory controller; and
  storing a predetermined value in the first register.

9. The computer-implemented method of claim 1, further comprising, subsequent to initializing the first register, initializing the third register to an initial value.

10. The computer-implemented method of claim 9, wherein the initial value comprises a fail status.

11. The computer-implemented method of claim 1, further comprising:
  receiving an initial value from a memory controller; and
  storing the initial value in the first register.

12. The computer-implemented method of claim 1, wherein the first register comprises a linear feedback shift register.

13. The computer-implemented method of claim 1, wherein at least one of the first data pattern or the second data pattern comprises a pseudorandom bit sequence.

14. A system, comprising:
  a memory controller; and
  a memory device coupled to the memory controller, and that:
    initializes a first register on the memory device with a first data pattern based on a seed value stored in a second register;
    receives, from the memory controller, a second data pattern on an input pin of the memory device;
    compares the first data pattern with the second data pattern to generate a results value; and
    stores the results value in a third register.

15. The system of claim 14, where the memory device further:
  determines that the first data pattern matches the second data pattern,
  wherein the results value indicates a pass result.

16. The system of claim 14, where the memory device further:
  determines that the first data pattern does not match the second data pattern,
  wherein the results value indicates a fail result.

17. The system of claim 14, where the memory device further:
  receives a command to read the results value; and
  transmits the results value to an output pin of the memory device.

18. The system of claim 17, where the memory device further, subsequent to transmitting the results value, initializes the third register to an initial value.

19. The system of claim 14, wherein, when the memory device compares the first data pattern with the second data pattern, the memory device performs an exclusive-or (XOR) operation on the first data pattern and the second data pattern.

20. The system of claim 19, wherein the results value is based on an output of the XOR operation.

* * * * *